(12) United States Patent
Taniguchi

(10) Patent No.: US 12,191,842 B2
(45) Date of Patent: Jan. 7, 2025

(54) ACOUSTIC WAVE DEVICE

(71) Applicant: Murata Manufacturing Co., Ltd., Nagaokakyo (JP)

(72) Inventor: Yasumasa Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 326 days.

(21) Appl. No.: 17/952,369

(22) Filed: Sep. 26, 2022

(65) Prior Publication Data

US 2023/0016324 A1 Jan. 19, 2023

Related U.S. Application Data

(63) Continuation of application No. PCT/JP2021/012923, filed on Mar. 26, 2021.

(30) Foreign Application Priority Data

Mar. 31, 2020 (JP) .................. 2020-063191

(51) Int. Cl.
*H03H 9/17* (2006.01)
*H03H 9/125* (2006.01)
(Continued)

(52) U.S. Cl.
CPC ............ *H03H 9/175* (2013.01); *H03H 9/125* (2013.01); *H03H 9/25* (2013.01); *H03H 9/54* (2013.01)

(58) Field of Classification Search
CPC .......... H03H 9/175; H03H 9/125; H03H 9/25; H03H 9/54
See application file for complete search history.

(56) References Cited

U.S. PATENT DOCUMENTS 9,602,076 B1 3/2017 Kreuzer et al.
2004/0100342 A1 5/2004 Nishihara et al.
(Continued)

FOREIGN PATENT DOCUMENTS

JP 2004173191 A 6/2004
JP 2006339873 A 12/2006
(Continued)

OTHER PUBLICATIONS

International Search Report in PCT/JP2021/012923, mailed Jun. 8, 2021, 4 pages.

(Continued)

*Primary Examiner* — Samuel S Outten
(74) *Attorney, Agent, or Firm* — Keating & Bennett, LLP

(57) ABSTRACT

An acoustic wave device includes a piezoelectric layer, first and second upper electrodes, first and second lower electrodes, and first and second acoustic reflection films. In plan view, first and second resonator portions are respectively defined by portions where the first upper electrode and the first lower electrode overlap and where the second upper electrode and the second lower electrode overlap. The first and second acoustic reflection films respectively include first and second metal layers. First and second overlapping portions are respectively defined by portions where only the first upper electrode overlaps with the first metal layer and where only the second upper electrode overlaps with the second metal layer. An area of the first resonator portion is smaller than an area of the second resonator portion and an area of the first overlapping portion is larger than an area of the second overlapping portion.

16 Claims, 4 Drawing Sheets

(51) Int. Cl.
  *H03H 9/25*   (2006.01)
  *H03H 9/54*   (2006.01)

(56)          References Cited

U.S. PATENT DOCUMENTS

2006/0267711 A1   11/2006  Yanase et al.
2014/0273881 A1   9/2014   Tajic
2020/0127636 A1   4/2020   Kishimoto
2020/0220518 A1   7/2020   Omura
2020/0220521 A1   7/2020   Omura
2021/0111697 A1   4/2021   Daimon et al.

FOREIGN PATENT DOCUMENTS

JP    2018207376 A     12/2018
WO    2018235605 A1    12/2018
WO    2018235731 A1    12/2018
WO    2019065666 A1    4/2019
WO    2019065669 A1    4/2019
WO    2020009121 A1    1/2020

OTHER PUBLICATIONS

Written Opinion in PCT/JP2021/012923, mailed Jun. 8, 2021, 6 pages.

ACOUSTIC WAVE DEVICE

CROSS REFERENCE TO RELATED APPLICATIONS

This application claims the benefit of priority to Japanese Patent Application No. 2020-063191 filed on Mar. 31, 2020 and is a Continuation Application of PCT Application No. PCT/JP2021/012923 filed on Mar. 26, 2021. The entire contents of each application are hereby incorporated herein by reference.

BACKGROUND OF THE INVENTION

1. Field of the Invention

The present invention relates to an acoustic wave device.

2. Description of the Related Art

Conventionally, acoustic wave devices have been widely used for filters of cellular phones, for example. Patent Application Publication No. 2014/0273881 discloses an example of an acoustic wave device that is used as a bulk acoustic wave (BAW) element. In this acoustic wave device, an upper electrode is provided on one main surface of a piezoelectric layer and a lower electrode is provided on the other main surface. A reflection layer is laminated to cover the lower electrode on the other main surface of the piezoelectric layer. The reflection layer includes a dielectric layer, which is made of $SiO_2$ or the like, and a conductor layer, which is made of tungsten or the like. The conductor layer has an elongated portion that is elongated to the outside of an active region.

International Publication No. 2018/235605 discloses an acoustic wave device that is used as a series arm resonator or a parallel arm resonator of a ladder filter. In this acoustic wave device, a piezoelectric layer is provided on an acoustic reflection layer. An IDT electrode is provided on the piezoelectric layer. The acoustic reflection layer includes a dielectric layer and a metal layer.

Filter characteristics of acoustic wave devices have been required to be further improved in recent years. However, acoustic wave devices such as the acoustic wave devices of Patent Application Publication No. 2014/0273881 and International Publication No. 2018/235605 have a possibility that intermodulation distortion (IMD) cannot be sufficiently suppressed.

SUMMARY OF THE INVENTION

Preferred embodiments of the present invention provide acoustic wave devices that are each able to reduce or prevent IMD.

An acoustic wave device according to a preferred embodiment of the present invention includes a first acoustic wave resonator and a second acoustic wave resonator which are electrically connected with each other, a piezoelectric layer including a first main surface and a second main surface which are opposed to each other, a first upper electrode on the first main surface, a second upper electrode on the first main surface, a first lower electrode on the second main surface of the piezoelectric layer so as to overlap with the first upper electrode in a plan view, and a second lower electrode on the second main surface of the piezoelectric layer so as to overlap with the second upper electrode in the plan view. A portion at which the first upper electrode and the first lower electrode mutually overlap in the plan view defines a first resonator portion, and a portion at which the second upper electrode and the second lower electrode mutually overlap in the plan view defines a second resonator portion. The acoustic wave device further includes a first acoustic reflection film on the second main surface of the piezoelectric layer so as to overlap with the first resonator portion in the plan view and cover at least a portion of the first lower electrode, and a second acoustic reflection film on the second main surface of the piezoelectric layer so as to overlap with the second resonator portion in the plan view and cover at least a portion of the second lower electrode. The first acoustic reflection film includes at least one first metal layer and the second acoustic reflection film includes at least one second metal layer. The first acoustic wave resonator and the second acoustic wave resonator share the piezoelectric layer, and the first acoustic wave resonator includes the first upper electrode, the first lower electrode, and the first acoustic reflection film, and the second acoustic wave resonator includes the second upper electrode, the second lower electrode, and the second acoustic reflection film. A portion at which only the first upper electrode of the first upper electrode and the first lower electrode overlaps with the first metal layer in the plan view defines a first overlapping portion, and a portion at which only the second upper electrode of the second upper electrode and the second lower electrode overlaps with the second metal layer in the plan view defines a second overlapping portion. An area of the first resonator portion in the plan view is smaller than an area of the second resonator portion in the plan view, and an area of the first overlapping portion in the plan view is larger than an area of the second overlapping portion in the plan view.

An acoustic wave device according to a preferred embodiment of the present invention includes a first acoustic wave resonator and a second acoustic wave resonator which are electrically connected with each other without interposing any other elements therebetween, a piezoelectric layer including a first main surface and a second main surface which are opposed to each other, a first IDT electrode on the first main surface and including a plurality of electrode fingers, a second IDT electrode on the first main surface and including a plurality of electrode fingers, a first wiring electrode on the first main surface and connected with the first IDT electrode, and a second wiring electrode on the first main surface and connected with the second IDT electrode. A portion at which the electrode fingers, which are adjacent to each other, of the first IDT electrode overlap with each other when viewed in an acoustic wave propagation direction defines a first resonator portion, and a portion at which the electrode fingers, which are adjacent to each other, of the second IDT electrode overlap with each other when viewed in the acoustic wave propagation direction defines a second resonator portion. The acoustic wave device further includes a first acoustic reflection film on the second main surface of the piezoelectric layer so as to overlap with the first resonator portion in plan view, and a second acoustic reflection film on the second main surface of the piezoelectric layer so as to overlap with the second resonator portion in plan view. The first acoustic reflection film includes at least one first metal layer and the second acoustic reflection film includes at least one second metal layer. The first acoustic wave resonator and the second acoustic wave resonator share the piezoelectric layer, and the first acoustic wave resonator includes the first IDT electrode and the first acoustic reflection film, and the second acoustic wave resonator includes the second IDT electrode and the second acoustic reflection film. A portion at which the first wiring electrode and the first metal layer overlap with each other in a plan view defines a first overlapping portion, and a portion at which the second wiring electrode and the second metal layer overlap with each other in the plan view defines a second overlapping portion. An area of the first resonator portion in the plan view is smaller than an area of the second resonator portion in the plan view, and an area of the first overlapping portion in the plan view is larger than an area of the second overlapping portion in the plan view.

According to preferred embodiments of the present invention, it is possible to provide acoustic wave devices in each of which IMD is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing preferred embodiments of the present invention with reference to the accompanying drawings.

Each of the preferred embodiments described in the present specification is exemplary and configurations can be partially exchanged or combined with each other between different preferred embodiments.

Figure 1:
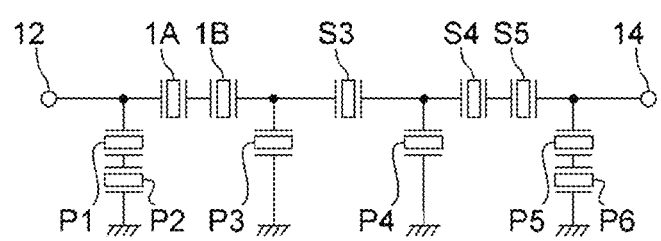
FIG. 1 is a circuit diagram of an acoustic wave device according to a first preferred embodiment of the present invention.

FIG. 1 is a circuit diagram of an acoustic wave device according to a first preferred embodiment of the present invention.

An acoustic wave device 10 is, for example, a ladder filter. The acoustic wave device 10 includes a plurality of series arm resonators and a plurality of parallel arm resonators. In the present preferred embodiment, the acoustic wave device 10 is, for example, a filter device for WiFi. However, the application of the acoustic wave device 10 is not limited to this application. A pass band of the acoustic wave device 10 is not particularly limited.

The acoustic wave device 10 includes an antenna terminal 12, a first acoustic wave resonator 1A, and a second acoustic wave resonator 1B. The antenna terminal 12 is connected to an antenna. In the circuit configuration of the acoustic wave device 10, a series arm is connected to the antenna terminal 12. Each of the first acoustic wave resonator 1A and the second acoustic wave resonator 1B is a series arm resonator. The first acoustic wave resonator 1A and the second acoustic wave resonator 1B are electrically connected with each other without interposing any other elements therebetween. More specifically, the first acoustic wave resonator 1A and the second acoustic wave resonator 1B are, for example, resonators obtained by serial division. In other words, the first acoustic wave resonator 1A and the second acoustic wave resonator 1B are connected with each other in series without interposing any parallel arm resonators therebetween, on a path coupling the antenna terminal 12 with another terminal 14.

Here, the first acoustic wave resonator 1A and the second acoustic wave resonator 1B may be, for example, parallel arm resonators that are obtained by serial division. In this configuration, the first acoustic wave resonator 1A and the second acoustic wave resonator 1B are connected with each other in series on a path coupling a node, which is on the path coupling the antenna terminal 12 with another terminal 14, with a ground potential. However, the first acoustic wave resonator 1A and the second acoustic wave resonator 1B may be independent resonators.

Figure 2:
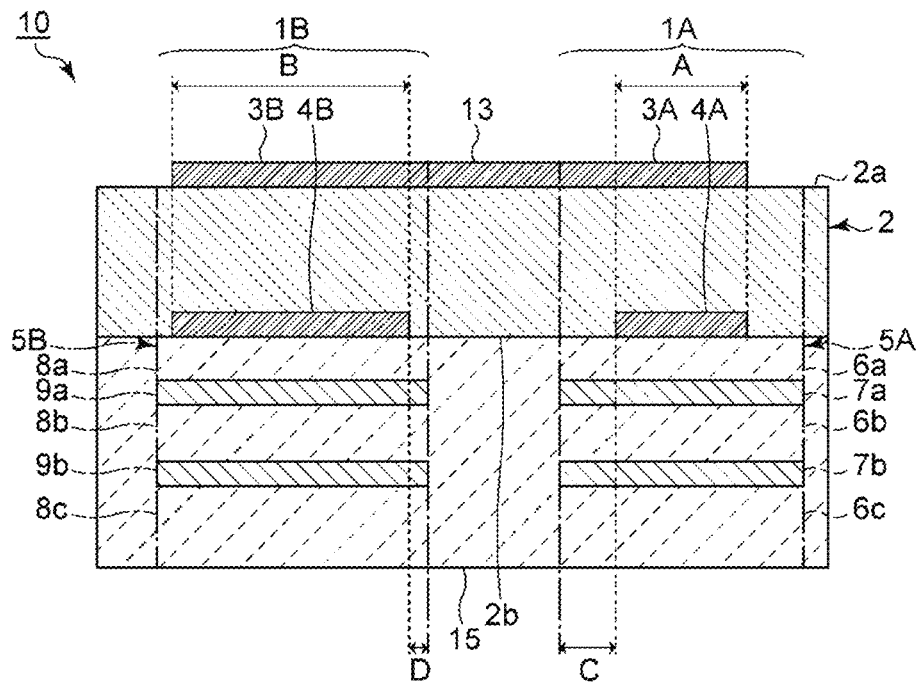
FIG. 2 is a front sectional view of a first acoustic wave resonator and a second acoustic wave resonator in the acoustic wave device according to the first preferred embodiment of the present invention.

FIG. 2 is a front sectional view of the first acoustic wave resonator and the second acoustic wave resonator in the acoustic wave device according to the first preferred embodiment.

The acoustic wave device 10 includes a piezoelectric layer 2. The piezoelectric layer 2 includes a first main surface 2a and a second main surface 2b. The first main surface 2a and the second main surface 2b are opposed to each other. In the present specification, the first main surface 2a side is defined as an upper side and the second main surface 2b side is defined as a lower side. The first acoustic wave resonator 1A and the second acoustic wave resonator 1B share the piezoelectric layer 2.

On the first main surface 2a of the piezoelectric layer 2, a first upper electrode 3A and a second upper electrode 3B are provided. On the second main surface 2b, a first lower electrode 4A and a second lower electrode 4B are provided. Further, a first acoustic reflection film 5A is provided on the second main surface 2b to cover the first lower electrode 4A. A second acoustic reflection film 5B is provided on the second main surface 2b to cover the second lower electrode 4B.

The first acoustic reflection film 5A includes a plurality of first low acoustic impedance layers and a plurality of first high acoustic impedance layers. Here, the low acoustic impedance layer is a layer whose acoustic impedance is relatively low. The high acoustic impedance layer is a layer whose acoustic impedance is relatively high. More specifically, the acoustic impedance of the first low acoustic impedance layer is lower than the acoustic impedance of the first high acoustic impedance layer. In the present preferred embodiment, the plurality of first low acoustic impedance layers include a first low acoustic impedance layer 6a, a first low acoustic impedance layer 6b, and a first low acoustic impedance layer 6c, which are illustrated in FIG. 2. The plurality of first high acoustic impedance layers include a first high acoustic impedance layer 7a and a first high acoustic impedance layer 7b. The plurality of first low acoustic impedance layers and the plurality of first high acoustic impedance layers are alternately laminated. Here, it is sufficient to provide at least one first low acoustic impedance layer and at least one first high acoustic impedance layer.

The second acoustic reflection film 5B includes a plurality of second low acoustic impedance layers and a plurality of second high acoustic impedance layers. The acoustic impedance of the second low acoustic impedance layer is lower than the acoustic impedance of the second high acoustic impedance layer. In the present preferred embodiment, the plurality of second low acoustic impedance layers include a second low acoustic impedance layer 8a, a second low acoustic impedance layer 8b, and a second low acoustic impedance layer 8c, which are illustrated in FIG. 2. The plurality of second high acoustic impedance layers include a second high acoustic impedance layer 9a and a second high acoustic impedance layer 9b. The plurality of second low acoustic impedance layers and the plurality of second high acoustic impedance layers are alternately laminated. Here, it is sufficient to provide at least one second low acoustic impedance layer and at least one second high acoustic impedance layer.

The periphery of the first acoustic reflection film 5A and the second acoustic reflection film 5B is covered by an intermediate layer 15. Here, the periphery is a periphery in a direction that is orthogonal or substantially orthogonal to a thickness direction of the first acoustic reflection film 5A and the second acoustic reflection film 5B. Dashed-dotted lines in FIG. 2 indicate a boundary between the first acoustic reflection film 5A and the intermediate layer 15 and a boundary between the second acoustic reflection film 5B and the intermediate layer 15. The intermediate layer 15 is made of arbitrary dielectric. Here, the intermediate layer 15 may be made of, for example, the same material as that of the first low acoustic impedance layer and second low acoustic impedance layer.

The first acoustic wave resonator 1A is a resonator including the first upper electrode 3A, the first lower electrode 4A, and the first acoustic reflection film 5A. The second acoustic wave resonator 1B is a resonator including the second upper electrode 3B, the second lower electrode 4B, and the second acoustic reflection film 5B. A portion at which the first upper electrode 3A and the first lower electrode 4A mutually overlap in plan view defines the first resonator portion A. A portion at which the second upper electrode 3B and the second lower electrode 4B mutually overlap in plan view defines the second resonator portion B. An area of the first resonator portion A in plan view is smaller than an area of the second resonator portion B in plan view. The plan view in the present specification indicates a direction viewed from the upper side in FIG. 2.

The first acoustic reflection film 5A only needs to cover at least a portion of the first lower electrode 4A so as to overlap with the first resonator portion A in plan view. The second acoustic reflection film 5B only needs to cover at least a portion of the second lower electrode 4B so as to overlap with the second resonator portion B in plan view.

The first high acoustic impedance layer 7a and the first high acoustic impedance layer 7b in the first acoustic reflection film 5A are first metal layers. The second high acoustic impedance layer 9a and the second high acoustic impedance layer 9b in the second acoustic reflection film 5B are second metal layers. Here, the first acoustic reflection film 5A only needs to include at least one first metal layer. The second acoustic reflection film 5B only needs to include at least one second metal layer.

On the first main surface 2a of the piezoelectric layer 2, a connection electrode 13 is provided, as illustrated in FIG. 2. The connection electrode 13 electrically connects the first upper electrode 3A and the second upper electrode 3B with each other. Accordingly, the first acoustic wave resonator 1A and the second acoustic wave resonator 1B are electrically connected with each other. The first upper electrode 3A is defined as an electrode overlapping with at least one of the first lower electrode 4A and the first acoustic reflection film 5A in plan view. The second upper electrode 3B is defined as an electrode overlapping with at least one of the second lower electrode 4B and the second acoustic reflection film 5B in plan view. The connection electrode 13 does not overlap with the first lower electrode 4A, the second lower electrode 4B, the first acoustic reflection film 5A, or the second acoustic reflection film 5B in plan view. The dashed-dotted lines in FIG. 2 are lines also indicating a boundary between the connection electrode 13 and the first upper electrode 3A and a boundary between the connection electrode 13 and the second upper electrode 3B.

Figure 3:
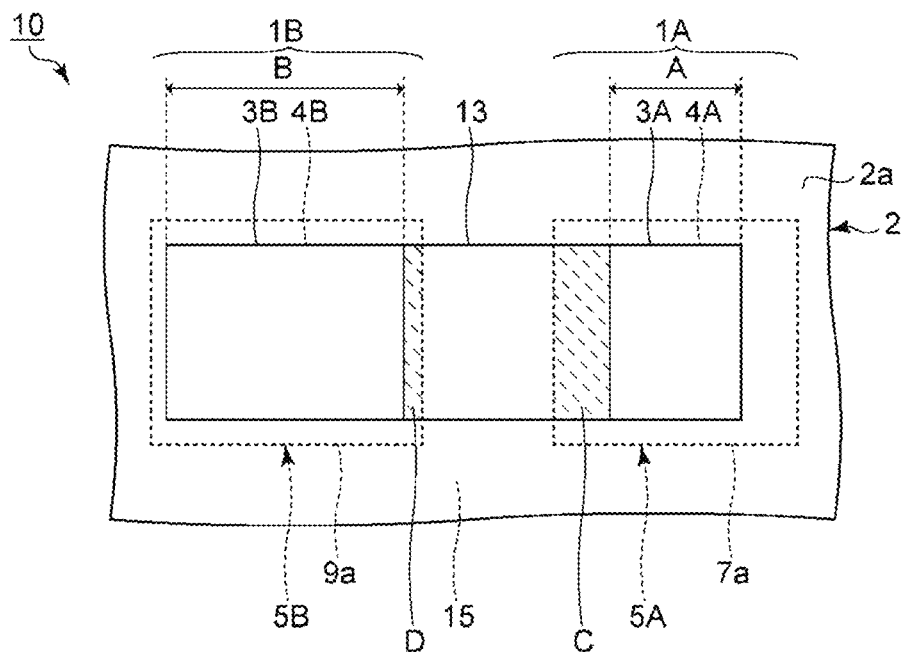
FIG. 3 is a plan view of the first acoustic wave resonator and the second acoustic wave resonator in the acoustic wave device according to the first preferred embodiment of the present invention.

FIG. 3 is a plan view of the first acoustic wave resonator and the second acoustic wave resonator in the acoustic wave device according to the first preferred embodiment. FIG. 3 illustrates a first overlapping portion and a second overlapping portion, which will be described later, by hatching. FIG. 3 omits wiring that connects the first acoustic wave resonator 1A and the second acoustic wave resonator 1B with other resonators and the like. The same is applied to plan views other than FIG. 3.

As illustrated in FIGS. 2 and 3, a portion at which only the first upper electrode 3A out of the first upper electrode 3A and the first lower electrode 4A overlaps with the first metal layer in plan view is defined as a first overlapping portion C. A portion at which only the second upper electrode 3B out of the second upper electrode 3B and the second lower electrode 4B overlaps with the second metal layer in plan view is defined as a second overlapping portion D. Unless otherwise noted, an area of each of the first resonator portion A, the second resonator portion B, the first overlapping portion C, and the second overlapping portion D is an area in plan view, in the present specification.

In the present preferred embodiment, the area of the first resonator portion A in plan view is smaller than the area of the second resonator portion B in plan view and the area of the first overlapping portion C in plan view is larger than the area of the second overlapping portion D in plan view. Accordingly, IMD can be reduced or prevented. Details of this advantageous effect will be described together with details of the circuit configuration and the like of the present preferred embodiment. In the following description, overlapping with the first upper electrode 3A in plan view means overlapping only with the first upper electrode 3A of the first upper electrode 3A and the first lower electrode 4A, unless otherwise noted. Overlapping with the second upper electrode 3B in plan view means overlapping only with the second upper electrode 3B of the second upper electrode 3B and the second lower electrode 4B, unless otherwise noted.

As illustrated in FIG. 1, the acoustic wave device 10 includes a plurality of resonators that are electrically connected with the first acoustic wave resonator 1A and the second acoustic wave resonator 1B. More specifically, the first acoustic wave resonator 1A, the second acoustic wave resonator 1B, a series arm resonator S3, a series arm resonator S4, and a series arm resonator S5 are connected with each other in series.

A parallel arm resonator P1 and a parallel arm resonator P2 are connected between a connection point, which is between the antenna terminal 12 and the first acoustic wave resonator 1A, and the ground potential. The parallel arm resonator P1 and the parallel arm resonator P2 are connected with each other in series. A parallel arm resonator P3 is connected between a connection point, which is between the second acoustic wave resonator 1B and the series arm resonator S3, and the ground potential. A parallel arm resonator P4 is connected between a connection point, which is between the series arm resonator S3 and the series arm resonator S4, and the ground potential. A parallel arm resonator P5 and a parallel arm resonator P6 are connected between the series arm resonator S5 and the ground potential. The parallel arm resonator P5 and the parallel arm resonator P6 are connected with each other in series. Here, the circuit configuration of the acoustic wave device 10 is not limited to the above-described configuration. For example, at least one resonator other than the first acoustic wave resonator 1A and the second acoustic wave resonator 1B may be provided. In this configuration, the at least one resonator only needs to be electrically connected with the first acoustic wave resonator 1A and the second acoustic wave resonator 1B. The resonator may be, for example, a BAW element or a surface acoustic wave (SAW) element. Alternatively, the resonator may be, for example, a longitudinally coupled resonator acoustic wave filter.

In the present preferred embodiment, the piezoelectric layer 2 illustrated in FIG. 2 is, for example, an aluminum nitride layer. More specifically, the piezoelectric layer 2 is, for example, an AlN layer. However, the material of the piezoelectric layer 2 is not limited to the above-described material. For example, lithium tantalate, lithium niobate, zinc oxide, quartz, lead zirconate titanate (PZT), or the like may be used.

The first upper electrode 3A, the second upper electrode 3B, the first lower electrode 4A, and the second lower electrode 4B are, for example, tungsten electrodes. However, the material of each of the above-described electrodes is not limited to this.

Each of the first high acoustic impedance layers and each of the second high acoustic impedance layers are, for example, tungsten layers. However, the material of each of the first high acoustic impedance layers and each of the second high acoustic impedance layers is not limited to the above-described material. For example, metal such as platinum and molybdenum or dielectric such as aluminum nitride and silicon nitride may be used.

Each of the first low acoustic impedance layers and each of the second low acoustic impedance layers are, for example, silicon oxide layers. More specifically, each of the above-mentioned layers is, for example, a $SiO_2$ layer. However, the material of each of the first low acoustic impedance layers and each of the second low acoustic impedance layers is not limited to the above-described material. For example, metal such as aluminum may be used. The first low acoustic impedance layer may be the first metal layer. In a similar manner, the second low acoustic impedance layer may be the second metal layer. Here, the layer that is positioned closest to the piezoelectric layer 2 and covers the first lower electrode 4A in the first acoustic reflection film 5A is a dielectric layer. In a similar manner, the layer that is positioned closest to the piezoelectric layer 2 and covers the second lower electrode 4B in the second acoustic reflection film 5B is a dielectric layer.

In the present preferred embodiment, the intermediate layer 15 is made of the same material as that of the plurality of first low acoustic impedance layers and the plurality of second low acoustic impedance layers. Specifically, the intermediate layer 15 is, for example, a $SiO_2$ layer. However, the intermediate layer 15 may be made of a different material from that of the plurality of first low acoustic impedance layers and the plurality of second low acoustic impedance layers.

The advantageous effects of the present preferred embodiment will be described below by comparing the present preferred embodiment with a comparative example.

The comparative example is different from the first preferred embodiment in that the area of the first overlapping portion C in plan view is smaller than the area of the second overlapping portion D in plan view. IMD of an acoustic wave device having the configuration of the first preferred embodiment and IMD of the comparative example were compared to each other. More specifically, the comparison was performed on third-order IMD (IMD3) generated when two waves of a transmission signal of Band 1 and a reception signal of Band 1 were inputted from antenna terminals of the acoustic wave devices.

Figure 4:
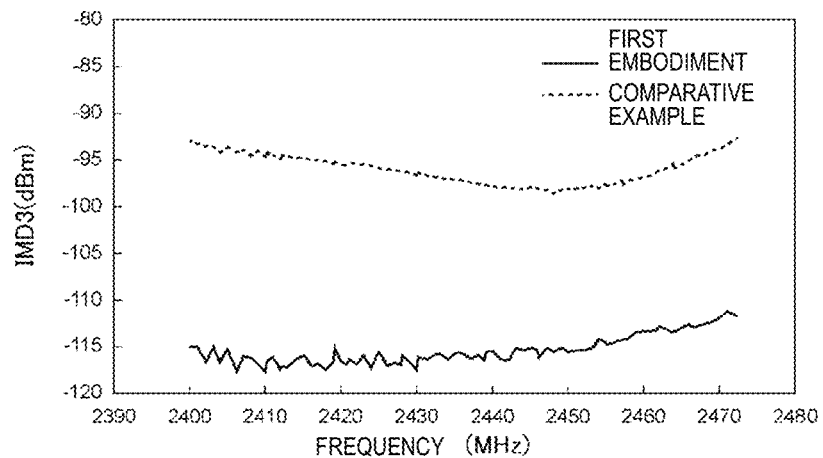
FIG. 4 is a graph showing IMD3 of the acoustic wave device according to the first preferred embodiment of the present invention and IMD3 of an acoustic wave device according to a comparative example.

FIG. 4 is a graph showing IMD3 of the acoustic wave device according to the first preferred embodiment and IMD3 of an acoustic wave device according to the comparative example.

FIG. 4 shows that IMD3 is reduced in the first preferred embodiment compared to the comparative example. This is because of the following reasons. The area of the first resonator portion of the first acoustic wave resonator is smaller than the area of the second resonator portion of the second acoustic wave resonator in the first preferred embodiment and the comparative example. In this configuration, the capacitance of the first acoustic wave resonator is smaller than the capacitance of the second acoustic wave resonator. As capacitance is smaller, IMD is more easily generated in acoustic wave resonators. In the comparative example, IMD is easily generated in the first acoustic wave resonator and the IMD in the first acoustic wave resonator cannot be reduced or prevented.

On the other hand, the area of the first overlapping portion C is larger than the area of the second overlapping portion D in the first preferred embodiment. As described above, the first overlapping portion C is the portion at which only the first upper electrode 3A of the first upper electrode 3A and the first lower electrode 4A overlaps with the first metal layer in plan view. The second overlapping portion D is the portion at which only the second upper electrode 3B of the second upper electrode 3B and the second lower electrode 4B overlaps with the second metal layer in plan view. In addition to the capacitance of the first resonator portion A, the capacitance of the first overlapping portion C is added, in the first acoustic wave resonator 1A. The capacitance of the first overlapping portion C is, in other words, compensation capacitance. In a similar manner, in addition to the capacitance of the second resonator portion B, compensation capacitance of the second overlapping portion D is added, also in the second acoustic wave resonator 1B. Here, since the area of the first overlapping portion C is larger than the area of the second overlapping portion D, the compensation capacitance added in the first acoustic wave resonator 1A is larger than the compensation capacitance added in the second acoustic wave resonator 1B. Accordingly, IMD is effectively reduced or prevented in the first acoustic wave resonator 1A. Thus, IMD can be reduced or prevented in the acoustic wave device 10 as a whole in the first preferred embodiment.

When a resonator is serially divided in the configuration in which the area of the first resonator portion A is smaller than the area of the second resonator portion B as in the present preferred embodiment, the area of the first overlapping portion C only needs to be set to be larger than the area of the second overlapping portion D. Accordingly, IMD can be reduced or prevented. Preferred embodiments of the present invention are thus especially favorable in a configuration in which a resonator is serially divided.

The first acoustic reflection film 5A of the first acoustic wave resonator 1A includes the plurality of first metal layers as illustrated in FIG. 2. Entire or substantially entire surfaces of the plurality of first metal layers overlap with each other in plan view. However, the plurality of first metal layers may include portions that do not overlap with each other in plan view. In this configuration as well, a portion at which at least one first metal layer and the first upper electrode 3A overlap with each other in plan view is the first overlapping portion C. In a similar manner, a portion at which at least one second metal layer and the second upper electrode 3B overlap with each other in plan view is the second overlapping portion D. Here, it is preferable that an area of a portion at which the first metal layer positioned closest to the piezoelectric layer 2 and the first upper electrode 3A overlap with each other in plan view is larger than an area of a portion at which the second metal layer positioned closest to the piezoelectric layer 2 and the second upper electrode 3B overlap with each other in plan view. Accordingly, IMD can be more securely reduced or prevented.

A first modification and a second modification of the first preferred embodiment will be described below. Circuit configurations of the first modification and the second modification are different from the circuit configuration of the first preferred embodiment. IMD can be reduced or prevented also in the first modification and the second modification as is the case with the first preferred embodiment.

Figure 5:
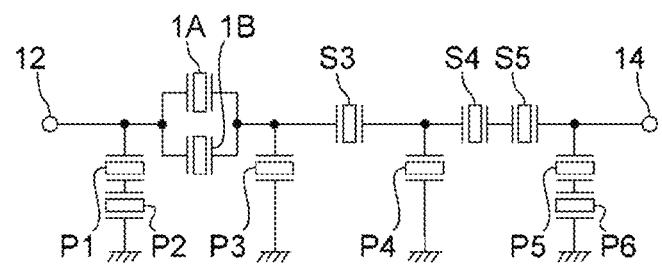
FIG. 5 is a circuit diagram of an acoustic wave device according to a first modification of the first preferred embodiment of the present invention.

In the first modification illustrated in FIG. 5, the first acoustic wave resonator 1A and the second acoustic wave resonator 1B are connected with each other in parallel. More specifically, the first acoustic wave resonator 1A and the second acoustic wave resonator 1B are obtained by parallel division. In other words, the first acoustic wave resonator 1A and the second acoustic wave resonator 1B are connected with each other in parallel on the path coupling the antenna terminal 12 with the other terminal 14.

Here, the first acoustic wave resonator 1A and the second acoustic wave resonator 1B may be parallel arm resonators that are obtained by parallel division. In this configuration, the first acoustic wave resonator 1A and the second acoustic wave resonator 1B are connected with each other in parallel on the path coupling a node, which is on the path coupling the antenna terminal 12 with the other terminal 14, with the ground potential. However, the first acoustic wave resonator 1A and the second acoustic wave resonator 1B may be independent resonators. Preferred embodiments of the present invention are thus especially favorable in a configuration in which a resonator is divided in parallel.

Figure 6:
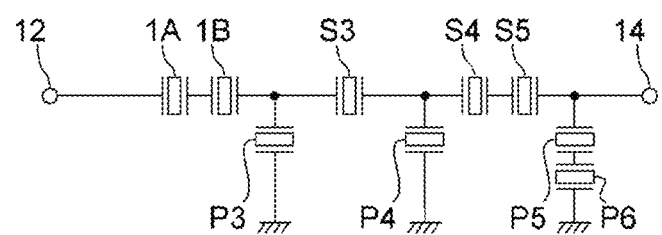
FIG. 6 is a circuit diagram of an acoustic wave device according to a second modification of the first preferred embodiment of the present invention.

In the second modification illustrated in FIG. 6, the first acoustic wave resonator 1A and the second acoustic wave resonator 1B are closest to the antenna terminal 12. The resonator closest to the antenna terminal 12 indicates at least one of a parallel arm resonator, which is closest to an antenna end among one or more pieces of parallel arm resonators, and a series arm resonator, which is closest to the antenna end among one or more pieces of series arm resonators. In the present modification, the first acoustic wave resonator 1A and the second acoustic wave resonator 1B are resonators obtained by serial division. Therefore, both of the first acoustic wave resonator 1A and the second acoustic wave resonator 1B are closest to the antenna terminal 12.

When an acoustic wave device is used for a multiplexer and the like, IMD of a resonator closest to the antenna terminal especially largely influences on other filter devices. Therefore, when the acoustic wave device of the present modification is used for a multiplexer and the like, an influence of IMD with respect to a filter device, which is commonly connected with the acoustic wave device and the antenna terminal 12, can be effectively reduced or prevented.

In the present modification, the first acoustic wave resonator 1A and the second acoustic wave resonator 1B are obtained by serial division as is the case with the first preferred embodiment. IMD is effectively reduced or prevented in the first acoustic wave resonator 1A and the second acoustic wave resonator 1B. Therefore, it is sufficient that the first acoustic wave resonator 1A or the second acoustic wave resonator 1B is closest to the antenna terminal 12. This configuration can effectively reduce or prevent the above-described influence of IMD on other filter devices.

Figure 7:
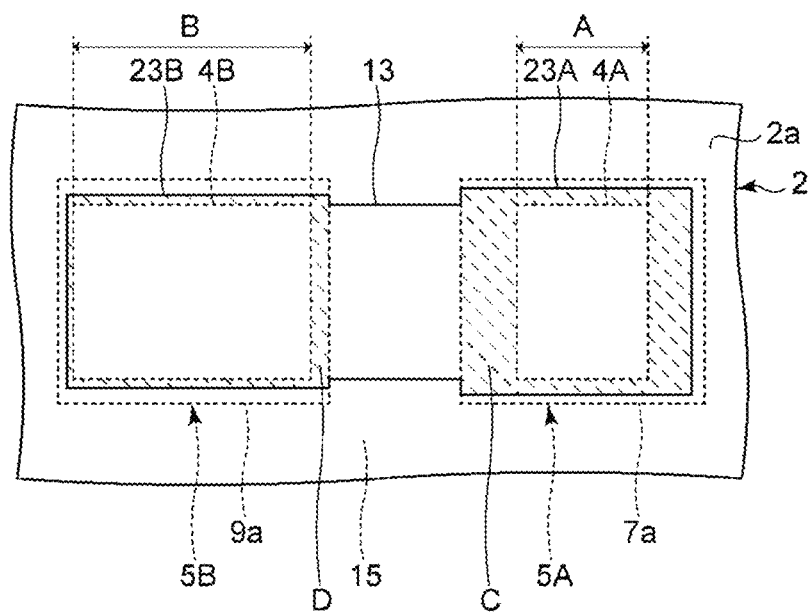
FIG. 7 is a plan view of an acoustic wave device according to a third modification of the first preferred embodiment of the present invention.

Here, the first overlapping portion C is positioned closer to the connection electrode 13 than the first lower electrode 4A in plan view, in the first preferred embodiment. The second overlapping portion D is positioned closer to the connection electrode 13 than the second lower electrode 4B in plan view. However, the arrangement of the first overlapping portion C and the second overlapping portion D is not limited to this. For example, as illustrated in FIG. 7, an outer circumferential edge of a first upper electrode 23A is positioned around an outer circumferential edge of the first lower electrode 4A in plan view in a third modification of the first preferred embodiment. Accordingly, the first overlapping portion C is positioned around the first lower electrode 4A in plan view. In a similar manner, an outer circumferential edge of a second upper electrode 23B is positioned around an outer circumferential edge of the second lower electrode 4B in plan view. Accordingly, the second overlapping portion D is positioned around the second lower electrode 4B in plan view.

In the first preferred embodiment and the modifications of the first preferred embodiment, the first upper electrode and the second upper electrode are connected with each other in the first acoustic wave resonator and the second acoustic wave resonator. However, the first lower electrode and the second lower electrode may be electrically connected with each other in the first acoustic wave resonator and the second acoustic wave resonator.

Figure 8:
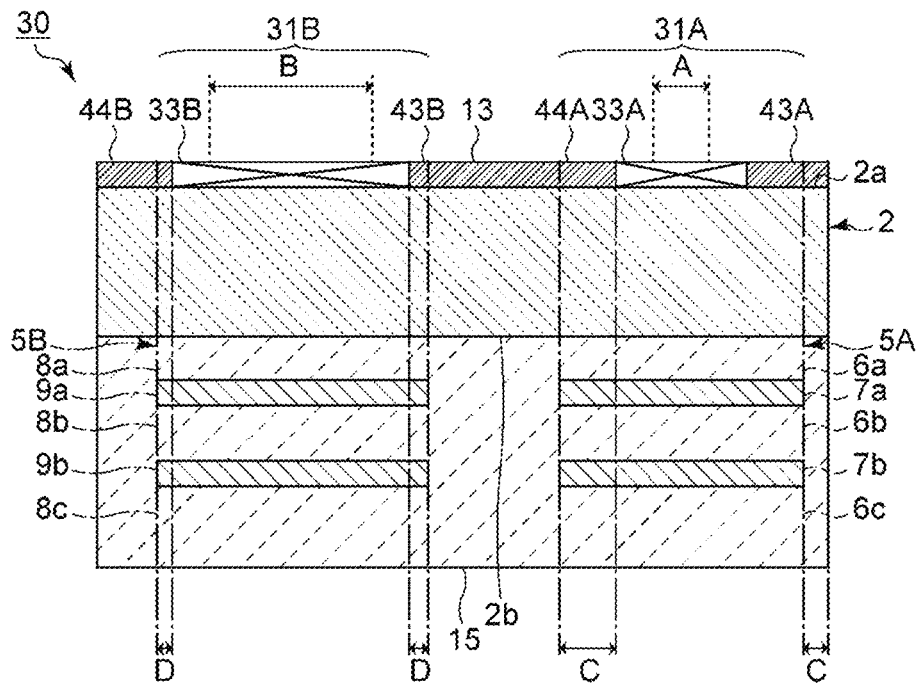
FIG. 8 is a simplified front sectional view of a first acoustic wave resonator and a second acoustic wave resonator in an acoustic wave device according to a second preferred embodiment of the present invention.
Figure 9:
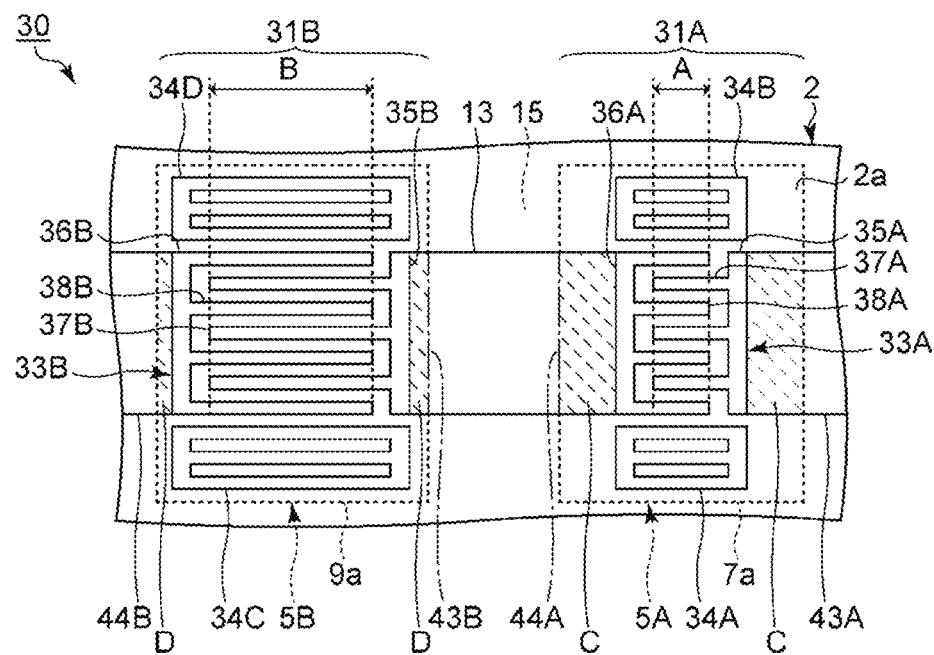
FIG. 9 is a plan view of the first acoustic wave resonator and the second acoustic wave resonator in the acoustic wave device according to the second preferred embodiment of the present invention.

FIG. 8 is a simplified front sectional view of a first acoustic wave resonator and a second acoustic wave resonator in an acoustic wave device according to a second preferred embodiment of the present invention. FIG. 9 is a plan view of the first acoustic wave resonator and the second acoustic wave resonator in the acoustic wave device according to the second preferred embodiment. FIG. 8 illustrates the first acoustic wave resonator and the second acoustic wave resonator with a rough sketch of a rectangle having two diagonal lines.

The present preferred embodiment is different from the first preferred embodiment in that a first acoustic wave resonator 31A and a second acoustic wave resonator 31B, which are illustrated in FIGS. 8 and 9, are SAW elements and the present preferred embodiment is different in arrangement of the first overlapping portion C and the second overlapping portion D. Other than the above-described points, an acoustic wave device 30 of the present preferred embodiment has the same or substantially the same configuration as that of the acoustic wave device 10 of the first preferred embodiment.

The first acoustic wave resonator 31A and the second acoustic wave resonator 31B are electrically connected with each other without interposing other elements therebetween. The first acoustic wave resonator 31A and the second acoustic wave resonator 31B share the piezoelectric layer 2. As illustrated in FIG. 9, a first IDT electrode 33A and a second IDT electrode 33B are provided on the first main surface 2a of the piezoelectric layer 2. When an AC voltage is applied to the first IDT electrode 33A, an acoustic wave is excited. The same is applied to the second IDT electrode 33B. Reflectors 34A and 34B are provided in a pair on respective sides in an acoustic wave propagation direction of the first IDT electrode 33A on the first main surface 2a. Reflectors 34C and 34D are provided in a pair on respective sides in an acoustic wave propagation direction of the second IDT electrode 33B on the first main surface 2a.

The first IDT electrode 33A includes a first busbar 35A, a second busbar 36A, a plurality of first electrode fingers 37A, and a plurality of second electrode fingers 38A. One end of each of the plurality of first electrode fingers 37A is connected to the first busbar 35A. One end of each of the plurality of second electrode fingers 38A is connected to the second busbar 36A. The plurality of first electrode fingers 37A and the plurality of second electrode fingers 38A are interdigitated. In a similar manner, the second IDT electrode 33B includes a first busbar 35B, a second busbar 36B, a plurality of first electrode fingers 37B, and a plurality of second electrode fingers 38B.

As is the case with the first preferred embodiment, the first acoustic reflection film 5A, the second acoustic reflection film 5B, and the intermediate layer 15 are provided on the second main surface 2b of the piezoelectric layer 2. The first acoustic wave resonator 31A is a resonator including the first IDT electrode 33A, the reflector 34A, the reflector 34B, and the first acoustic reflection film 5A. The second acoustic wave resonator 31B is a resonator including the second IDT electrode 33B, the reflector 34C, the reflector 34D, and the second acoustic reflection film 5B.

In the first IDT electrode 33A, a region where the first electrode finger 37A and the second electrode finger 38A, which are adjacent to each other, overlap with each other when viewed in the acoustic wave propagation direction defines a first intersecting region. The first intersecting region is the first resonator portion A in the present preferred embodiment. Further, in the second IDT electrode 33B, a region where the first electrode finger 37B and the second electrode finger 38B, which are adjacent to each other, overlap with each other when viewed in the acoustic wave propagation direction defines a second intersecting region. The second intersecting region is the second resonator portion B. The area of the first resonator portion A in plan view is smaller than the area of the second resonator portion B in plan view.

The first acoustic reflection film 5A overlaps with the first resonator portion A in plan view. The second acoustic reflection film 5B overlaps with the second resonator portion B in plan view.

As illustrated in FIGS. 8 and 9, a first wiring electrode 43A, a first wiring electrode 44A, a second wiring electrode 43B, and a second wiring electrode 44B are provided on the first main surface 2a of the piezoelectric layer 2. The first wiring electrode 43A and the first wiring electrode 44A are connected to the first IDT electrode 33A. More specifically, the first wiring electrode 43A is connected to the first busbar 35A of the first IDT electrode 33A. The first wiring electrode 44A is connected to the second busbar 36A of the first IDT electrode 33A. Meanwhile, the second wiring electrode 43B and the second wiring electrode 44B are connected to the second IDT electrode 33B. More specifically, the second wiring electrode 43B is connected to the first busbar 35B of the second IDT electrode 33B. The second wiring electrode 44B is connected to the second busbar 36B of the second IDT electrode 33B.

Further, the connection electrode 13 is provided on the first main surface 2a. The connection electrode 13 electrically connects the first wiring electrode 44A and the second wiring electrode 43B with each other. Accordingly, the first acoustic wave resonator 31A and the second acoustic wave resonator 31B are electrically connected with each other. Here, the connection electrode 13 does not overlap with the first acoustic reflection film 5A or the second acoustic reflection film 5B in plan view. The dashed-dotted lines in FIG. 9 are lines indicating a boundary between the connection electrode 13 and the first wiring electrode 44A and a boundary between the connection electrode 13 and the second wiring electrode 43B.

In the present preferred embodiment, the first overlapping portion C is a region where the first wiring electrode 43A and the first wiring electrode 44A overlap with the first metal layer in the first acoustic reflection film 5A in plan view. More specifically, the first overlapping portion C is a region where the first wiring electrode 43A and the first wiring electrode 44A overlap with the first high acoustic impedance layer in plan view. Meanwhile, the second overlapping portion D is a region where the second wiring electrode 43B and the second wiring electrode 44B overlap with the second metal layer in the second acoustic reflection film 5B in plan view. More specifically, the second overlapping portion D is a region where the second wiring electrode 43B and the second wiring electrode 44B overlap with the second high acoustic impedance layer in plan view.

In the acoustic wave device 30, the area of the first resonator portion A in plan view is smaller than the area of the second resonator portion B in plan view and the area of the first overlapping portion C in plan view is larger than the area of the second overlapping portion D in plan view. Accordingly, IMD can be reduced or prevented as is the case with the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a first acoustic wave resonator and a second acoustic wave resonator, the first acoustic wave resonator and the second acoustic wave resonator being electrically connected with each other;
a piezoelectric layer including a first main surface and a second main surface which are opposed to each other;
a first upper electrode on the first main surface;
a second upper electrode on the first main surface;

a first lower electrode on the second main surface of the piezoelectric layer so as to overlap with the first upper electrode in a plan view;
a second lower electrode on the second main surface of the piezoelectric layer so as to overlap with the second upper electrode in the plan view;
a first resonator portion defined by a portion at which the first upper electrode and the first lower electrode mutually overlap in the plan view
a second resonator portion defined by a portion at which the second upper electrode and the second lower electrode mutually overlap in the plan view;
a first acoustic reflection film on the second main surface of the piezoelectric layer so as to overlap with the first resonator portion in the plan view and cover at least a portion of the first lower electrode; and
a second acoustic reflection film on the second main surface of the piezoelectric layer so as to overlap with the second resonator portion in the plan view and cover at least a portion of the second lower electrode; wherein
the first acoustic reflection film includes at least one first metal layer and the second acoustic reflection film includes at least one second metal layer;
the first acoustic wave resonator and the second acoustic wave resonator share the piezoelectric layer, the first acoustic wave resonator includes the first upper electrode, the first lower electrode, and the first acoustic reflection film, and the second acoustic wave resonator includes the second upper electrode, the second lower electrode, and the second acoustic reflection film;
a first overlapping portion is defined by a portion at which only the first upper electrode out of the first upper electrode and the first lower electrode overlaps with the first metal layer in the plan view;
a second overlapping portion is defined by a portion at which only the second upper electrode of the second upper electrode and the second lower electrode overlaps with the second metal layer in the plan view;
an area of the first resonator portion in the plan view is smaller than an area of the second resonator portion in the plan view; and
an area of the first overlapping portion in the plan view is larger than an area of the second overlapping portion in the plan view.

2. The acoustic wave device according to claim 1, wherein the first acoustic reflection film includes at least one first low acoustic impedance layer whose acoustic impedance is relatively low and at least one first high acoustic impedance layer whose acoustic impedance is relatively high, and the first low acoustic impedance layer and the first high acoustic impedance layer are alternately laminated;
the at least one first high acoustic impedance layer is the first metal layer;
the second acoustic reflection film includes at least one second low acoustic impedance layer whose acoustic impedance is relatively low and at least one second high acoustic impedance layer whose acoustic impedance is relatively high, and the second low acoustic impedance layer and the second high acoustic impedance layer are alternately laminated; and
the at least one second high acoustic impedance layer is the second metal layer.

3. The acoustic wave device according to claim 2, wherein the first acoustic wave resonator and the second acoustic wave resonator are connected with each other in series.

4. The acoustic wave device according to claim 2, wherein the first acoustic wave resonator and the second acoustic wave resonator are connected with each other in parallel.

5. The acoustic wave device according to claim 2, wherein the first acoustic wave resonator and the second acoustic wave resonator are connected with each other in parallel.

6. The acoustic wave device according to claim 1, wherein the first acoustic wave resonator and the second acoustic wave resonator are connected with each other in series.

7. The acoustic wave device according to claim 1, wherein the first acoustic wave resonator and the second acoustic wave resonator are connected with each other in parallel.

8. The acoustic wave device according to claim 1, further comprising:
an antenna terminal electrically connected with the first acoustic wave resonator and the second acoustic wave resonator and electrically connected with an antenna; and
at least one resonator electrically connected with the first acoustic wave resonator and the second acoustic wave resonator; wherein
one of the first acoustic wave resonator and the second acoustic wave resonator is closest to the antenna terminal among the first acoustic wave resonator, the second acoustic wave resonator, and the at least one resonator.

9. An acoustic wave device comprising:
a first acoustic wave resonator and a second acoustic wave resonator, the first acoustic wave resonator and the second acoustic wave resonator being electrically connected with each other without any other elements interposed therebetween;
a piezoelectric layer including a first main surface and a second main surface which are opposed to each other;
a first IDT electrode on the first main surface and including a plurality of electrode fingers;
a second IDT electrode on the first main surface and including a plurality of electrode fingers;
a first wiring electrode on the first main surface and connected with the first IDT electrode;
a second wiring electrode on the first main surface and connected with the second IDT electrode;
a first resonator portion defined by a portion at which the electrode fingers adjacent to each other of the first IDT electrode overlap with each other when viewed in an acoustic wave propagation direction;
a second resonator portion defined by a portion at which the electrode fingers adjacent to each other of the second IDT electrode overlap with each other when viewed in the acoustic wave propagation direction;
a first acoustic reflection film on the second main surface of the piezoelectric layer and overlapping with the first resonator portion in plan view; and
a second acoustic reflection film on the second main surface of the piezoelectric layer and overlapping with the second resonator portion in plan view; wherein
the first acoustic reflection film includes at least one first metal layer and the second acoustic reflection film includes at least one second metal layer;
the first acoustic wave resonator and the second acoustic wave resonator share the piezoelectric layer, the first acoustic wave resonator includes the first IDT electrode and the first acoustic reflection film, and the second acoustic wave resonator includes the second IDT electrode and the second acoustic reflection film;

a first overlapping portion is defined by a portion at which the first wiring electrode and the first metal layer overlap with each other in a plan view;

a second overlapping portion is defined by a portion at which the second wiring electrode and the second metal layer overlap with each other in the plan view;

an area of the first resonator portion in the plan view is smaller than an area of the second resonator portion in the plan view; and an area of the first overlapping portion in the plan view is larger than an area of the second overlapping portion in the plan view.

10. The acoustic wave device according to claim 9, wherein the first acoustic reflection film includes at least one first low acoustic impedance layer whose acoustic impedance is relatively low and at least one first high acoustic impedance layer whose acoustic impedance is relatively high, and the first low acoustic impedance layer and the first high acoustic impedance layer are alternately laminated;

the at least one first high acoustic impedance layer is the first metal layer;

the second acoustic reflection film includes at least one second low acoustic impedance layer whose acoustic impedance is relatively low and at least one second high acoustic impedance layer whose acoustic impedance is relatively high, and the second low acoustic impedance layer and the second high acoustic impedance layer are alternately laminated; and the at least one second high acoustic impedance layer is the second metal layer.

11. The acoustic wave device according to claim 10, wherein the first acoustic wave resonator and the second acoustic wave resonator are connected with each other in series.

12. The acoustic wave device according to claim 10, wherein the first acoustic wave resonator and the second acoustic wave resonator are connected with each other in parallel.

13. The acoustic wave device according to claim 10, wherein the first acoustic wave resonator and the second acoustic wave resonator are connected with each other in parallel.

14. The acoustic wave device according to claim 9, wherein the first acoustic wave resonator and the second acoustic wave resonator are connected with each other in series.

15. The acoustic wave device according to claim 9, wherein the first acoustic wave resonator and the second acoustic wave resonator are connected with each other in parallel.

16. The acoustic wave device according to claim 9, further comprising:

an antenna terminal electrically connected with the first acoustic wave resonator and the second acoustic wave resonator and electrically connected with an antenna; and at least one resonator electrically connected with the first acoustic wave resonator and the second acoustic wave resonator; wherein one of the first acoustic wave resonator and the second acoustic wave resonator is closest to the antenna terminal among the first acoustic wave resonator, the second acoustic wave resonator, and the at least one resonator.

* * * * *